(12) United States Patent
Chesney (10) Patent No.: US 9,626,981 B2
(45) Date of Patent: Apr. 18, 2017

(54) SYSTEMS AND METHODS FOR COMPRESSING A DIGITAL SIGNAL

(71) Applicant: Cirrus Logic, Inc., Austin, TX (US)

(72) Inventor: Brian Parker Chesney, Bee Cave, TX (US)

(73) Assignee: Cirrus Logic, Inc., Austin, TX (US)

(*) Notice: Subject to any disclaimer, the term of this patent is extended or adjusted under 35 U.S.C. 154(b) by 0 days.

(21) Appl. No.: 14/745,795

(22) Filed: Jun. 22, 2015

(65) Prior Publication Data

US 2015/0380005 A1 Dec. 31, 2015

Related U.S. Application Data

(60) Provisional application No. 62/016,881, filed on Jun. 25, 2014.

(51) Int. Cl.
*H04N 1/405* (2006.01)
*H04N 1/407* (2006.01)
(Continued)

(52) U.S. Cl.
CPC .............. *G10L 19/04* (2013.01); *H03M 3/424* (2013.01); *H03M 3/428* (2013.01); *H03M 3/458* (2013.01); *H03M 3/466* (2013.01); *H03M 3/468* (2013.01)

(58) Field of Classification Search
CPC ...... H03M 3/412; H03M 3/424; H03M 7/304; H03M 3/452
(Continued)

(56) References Cited

U.S. PATENT DOCUMENTS 4,253,149 A * 2/1981 Cunningham ....... G05D 1/0206
318/588
4,631,749 A 12/1986 Rapaich
(Continued)

FOREIGN PATENT DOCUMENTS

CN 105264777 A 1/2016
EP 0173983 A2 3/1986
(Continued)

OTHER PUBLICATIONS

International Search Report and Written Opinion, International Application No. PCT/US2015/037101, mailed Jan. 4, 2016, 20 pages.
(Continued)

*Primary Examiner* — Akwasi M Sarpong
(74) *Attorney, Agent, or Firm* — Jackson Walker L.L.P.

(57) ABSTRACT

A system may include a delta-sigma analog-to-digital converter and a digital compression circuit. The delta-sigma analog-to-digital converter may include a loop filter having a loop filter input configured to receive an input signal and generate an intermediate signal responsive to the input signal, a multi-bit quantizer configured to quantize the intermediate signal into an uncompressed digital output signal, and a feedback digital-to-analog converter having a feedback output configured to generate a feedback output signal responsive to the uncompressed digital output signal in order to combine the input signal and the feedback output signal at the loop filter input. The digital compression circuit may be configured to receive the uncompressed digital output signal and compress the uncompressed digital output signal into a compressed digital output signal having fewer quantization levels than that of the uncompressed digital output signal.

54 Claims, 4 Drawing Sheets

(51) Int. Cl.
    *H04N 1/00* (2006.01)
    *G10L 19/04* (2013.01)
    *H03M 3/00* (2006.01)
(58) Field of Classification Search
    USPC .................. 704/500, E19; 341/158, 61, 155
    See application file for complete search history.

(56) References Cited

U.S. PATENT DOCUMENTS

| | | | |
|---|---|---|---|
| 5,243,345 A | 9/1993 | Naus et al. | |
| 5,247,210 A | 9/1993 | Swanson | |
| 5,603,088 A | 2/1997 | Gorday et al. | |
| 6,414,613 B1* | 7/2002 | Midya | H03M 7/3006 |
| | | | 341/138 |
| 6,566,942 B2 | 5/2003 | Shigenobu | |
| 6,724,332 B1 | 4/2004 | Melanson | |
| 6,738,004 B2 | 5/2004 | Melanson | |
| 6,809,572 B2 | 10/2004 | Yi et al. | |
| 6,822,594 B1 | 11/2004 | Melanson et al. | |
| 6,879,275 B1 | 4/2005 | Melanson | |
| 6,933,871 B2 | 8/2005 | Melanson et al. | |
| 6,956,919 B2 | 10/2005 | Amar et al. | |
| 7,081,843 B2 | 7/2006 | Melanson | |
| 7,084,798 B2 | 8/2006 | Melanson | |
| 7,110,460 B1 | 9/2006 | Melanson et al. | |
| 7,116,721 B1 | 10/2006 | Melanson et al. | |
| 7,138,934 B2 | 11/2006 | Melanson | |
| 7,148,830 B2 | 12/2006 | Melanson | |
| 7,164,379 B1 | 1/2007 | Rao | |
| 7,170,434 B2 | 1/2007 | Melanson | |
| 7,183,957 B1 | 2/2007 | Melanson | |
| 7,187,312 B2 | 3/2007 | Melanson | |
| 7,190,294 B2 | 3/2007 | Melanson | |
| 7,196,647 B2 | 3/2007 | Melanson | |
| 7,205,917 B2 | 4/2007 | Magrath | |
| 7,298,305 B2 | 11/2007 | Melanson | |
| 7,358,881 B2 | 4/2008 | Melanson | |
| 7,450,047 B1 | 11/2008 | Wu | |
| 7,649,484 B1 | 1/2010 | Wegener | |
| 8,396,230 B2 | 3/2013 | Chang et al. | |
| 8,890,051 B2 | 11/2014 | Funakoshi | |
| 8,907,829 B1 | 12/2014 | Naderi | |
| 9,076,554 B1 | 7/2015 | Zanchi et al. | |
| 9,332,345 B1 | 5/2016 | Melanson et al. | |
| 9,419,562 B1 | 8/2016 | Melanson et al. | |
| 2001/0014122 A1* | 8/2001 | Fu | H04N 21/234336 |
| | | | 375/240.12 |
| 2007/0018866 A1 | 1/2007 | Melanson | |
| 2007/0025442 A1* | 2/2007 | Okada | H04N 19/52 |
| | | | 375/240.03 |
| 2007/0127761 A1 | 6/2007 | Poulsen | |
| 2007/0152865 A1* | 7/2007 | Melanson | H03F 3/217 |
| | | | 341/155 |
| 2009/0073006 A1* | 3/2009 | Wegener | G10L 19/24 |
| | | | 341/61 |
| 2009/0278721 A1* | 11/2009 | Hamashita | H03M 3/412 |
| | | | 341/143 |
| 2009/0295615 A1* | 12/2009 | Steiner | H03M 3/424 |
| | | | 341/157 |
| 2010/0057474 A1* | 3/2010 | Kong | G10L 21/00 |
| | | | 704/500 |
| 2011/0112668 A1 | 5/2011 | Sorensen et al. | |
| 2011/0150260 A1 | 6/2011 | Miles | |
| 2012/0128181 A1 | 5/2012 | Lin et al. | |
| 2012/0224722 A1 | 9/2012 | Nystrom | |
| 2013/0051582 A1 | 2/2013 | Kropfitsch et al. | |
| 2013/0058495 A1 | 3/2013 | Furst | |
| 2013/0108074 A1* | 5/2013 | Reining | H04R 3/005 |
| | | | 381/92 |
| 2013/0271307 A1* | 10/2013 | Kropfitsch | H03G 3/002 |
| | | | 341/158 |
| 2013/0335131 A1 | 12/2013 | Ceballos et al. | |
| 2014/0140538 A1 | 5/2014 | Kropfitsch et al. | |
| 2014/0301571 A1 | 10/2014 | Melanson et al. | |
| 2014/0301572 A1 | 10/2014 | Melanson et al. | |
| 2014/0323844 A1 | 10/2014 | Deliwala | |
| 2014/0341397 A1 | 11/2014 | Straeussnigg et al. | |
| 2015/0086043 A1 | 3/2015 | Sridharan et al. | |
| 2015/0380005 A1* | 12/2015 | Chesney | H03M 3/428 |
| | | | 704/500 |

FOREIGN PATENT DOCUMENTS

| | | | |
|---|---|---|---|
| EP | 2421281 A2 | 2/2012 | |
| EP | 2984759 A2 | 2/2016 | |
| EP | 2984760 A2 | 2/2016 | |
| GB | 2459862 A | 11/2009 | |
| GB | 2459864 A | 11/2009 | |
| GB | 2508612 A | 6/2014 | |
| GB | 2513406 A | 10/2014 | |
| GB | 2530605 A | 3/2016 | |
| WO | 2013182901 A1 | 12/2013 | |
| WO | 2014168934 A2 | 10/2014 | |
| WO | 2014168939 A2 | 10/2014 | |
| WO | 2014174283 A1 | 10/2014 | |
| WO | 2015200267 A2 | 12/2015 | |

OTHER PUBLICATIONS

Anonymous: Data compression—Wikipedia, the free encyclopedia, Jun. 17, 2014, Retrieved from the Internet: https://en.wikipedia.org/w/index.php?title=Data_compression&oldid=613257125 [retrieved on Oct. 5, 2015], pp. 1-3, 7-9.

Anonymous: Lossless compression—Wikipedia, the free encyclopedia, Jun. 18, 2014, Retrieved from the Internet: https://en.wikipedia.org/w/index.php?title=Lossless_compression&oldid=613463592 [retrieved on Oct. 5, 2015], pp. 2-3, 5-6.

Abadi et al., Integrating compression and execution in column-oriented database systems, ACM Proceedings of SIGMOD. International Conference on Management of Data, Jun. 27, 2006, pp. 671-682.

Combined Search and Examination Report under Sections 17 and 18(3), Application No. GB1511091.9, mailed Jan. 21, 2016, 8 pages.

Bloom, I. and Nemirovsky, Y.; 1/ f Noise Reduction of Metal-Oxide-Semiconductor Transistors by Cycling from Inversion to Accumulation, Appl. Phys. Lett. 48 (15), Apr. 15, 1991, American Institute of Physics, pp. 1164-1166.

Koh, Jeongwook; Low-Frequency-Noise Reduction Technique for Linear Analog CMOS IC's, Dissertation, Lehrstuhl fur Technische Elektroniks der Technischen Universitat Munchen; 2005, 113 pages.

Kolhatkar, J.S., Salm, C., Knitel, M.J., and Wallinga, H.; Constant and Switched Bias Low Frequency Noise in p-MOSFETs with Varying Gate Oxide Thickness ESSDERC 2002, pp. 83-86.

Ersoy, Selcuk, Van Veldhoven, Robert H.M., Sebastiano, Fabio, Reimann, Klaus, Makinwa, Kofi A.A.; A 0.25mm2 AC-Biased MEMS Microphone Interface with 28dBA SNR, ISSCC 2013 / Session 22 / Sensors & Displays / 22.2, 2013 IEEE International Solid-State Circuits Conference, Digest of Technical Papers, Feb. 20, 2013, pp. 382-383.

International Search Report and Written Opinion, International Application No. PCT/US2014/033314, Nov. 7, 2014, 17 pages.

International Search Report and Written Opinion, International Application No. PCT/US2014/033302, Nov. 7, 2014, 10 pages.

International Search Report and Written Opinion, International Application No. PCT/GB2014/051262, Sep. 22, 2014, 18 pages.

Search Report under Section 17, GB Patent Application No. GB1307576.7, Oct. 9, 2013, 3 pages.

Zhou, et al., Precompensated excitation waveforms to suppress harmonic generation in MEMS electrostatic transducers, IEEE Transactions on Ultrasonics, Ferroelectrics and Frequency Control, vol. 51, Issue 11, Nov. 2004, pp. 1564-1574.

Jawed, Syed Arsalan, CMOS Readout Interfaces for MEMS Capacitive Microphones, Mar. 31, 2009, Retrieved from the Internet: http://eprints-phd.biblio.unitn.it/82/1/thesis_mems_microphone_readout.pdf.

(56) References Cited

OTHER PUBLICATIONS

O'Neal, J.B., Delta Modulation Quantizing Noise Analytical and Computer Simulation Results for Gaussian and Television Input Signals, Bell Systems Technical Journal, Jan. 1966, pp. 117-141.
U.S. Appl. No. 61/810,075, filed Apr. 9, 2013, inventors: John Melanson and John Tucker, 3 pages.
International Search Report and Written Opinion, International Application No. PCT/US2015/037101, mailed Mar. 23, 2016, 23 pages.
Colodro, Francisco et al., New Continuous-Time Multibit Sigma-Delta Modulators iwth Low Sensitivity to Clock Jitter, IEEE Transactions on Circuits and Systems I: Regular Papers, IEEE, US, vol. 56, No. 1, Jan. 1, 2009, pp. 74-83.
Muda, Lindasalwa et al., Voice Recognition Algorithms using Mel Frequency Cepstral Coefficient (MFCC) and Dynamic Time Warping (DTW) Techniques, Journal of Computing (vol. 2, issue 3), Mar. 22, 2010, pp. 138-143.
Eshraghi, A et al., A Comparison of Three Parallel Delta-Sigma A/D Converters, 1996 IEEE International Symposium on Circuits and Systems (ISCAS). Circuits and Systems Connecting the World, Atlanta, GA, May 12-15, 1996, pp. 517-520.

\* cited by examiner

SYSTEMS AND METHODS FOR COMPRESSING A DIGITAL SIGNAL

RELATED APPLICATIONS

The present disclosure claims priority to U.S. Provisional Patent Application Ser. No. 62/016,881, filed Jun. 25, 2014 which is incorporated by reference herein in its entirety.

FIELD OF DISCLOSURE

The present disclosure relates in general to audio systems, and more particularly, to compressing a digital signal in an audio system.

BACKGROUND

Microphones are ubiquitous on many devices used by individuals, including computers, tablets, smart phones, and many other consumer devices. Generally speaking, a microphone is an electroacoustic transducer that produces an electrical signal in response to deflection of a portion (e.g., a membrane or other structure) of a microphone caused by sound incident upon the microphone.

In a digital microphone system, an analog output signal of the microphone transducer may be processed by an analog-to-digital converter to convert the analog output signal to a digital output signal, which may be communicated over a bus to a digital audio processor for further processing. By communicating a digital signal over the bus rather than an analog signal, the audio signal may be less susceptible to noise.

To adequately represent an audio signal with sufficient quality, the digital output signal may have numerous quantization levels. Numerous quantization levels may require a significant number of digital bits in order that each quantization level is represented by a corresponding digital code. It may be undesirable to transmit digital codes with many bits and/or with bits that change frequently over a digital bus, particularly a serial digital bus, as communication throughput may decrease as the number of bits in digital codes increases.

SUMMARY

In accordance with the teachings of the present disclosure, certain disadvantages and problems associated with communication of a digital signal may be reduced or eliminated.

In accordance with embodiments of the present disclosure, a system may include a delta-sigma analog-to-digital converter and a digital compression circuit. The delta-sigma analog-to-digital converter may include a loop filter having a loop filter input configured to receive an input signal and generate an intermediate signal responsive to the input signal, a multi-bit quantizer configured to quantize the intermediate signal into an uncompressed digital output signal, and a feedback digital-to-analog converter having a feedback output configured to generate a feedback output signal responsive to the uncompressed digital output signal in order to combine the input signal and the feedback output signal at the loop filter input. The digital compression circuit may be configured to receive the uncompressed digital output signal and compress the uncompressed digital output signal into a compressed digital output signal having fewer quantization levels than that of the uncompressed digital output signal.

In accordance with these and other embodiments of the present disclosure, a method may include receiving an analog input signal at a loop filter input and filtering the analog input signal to generate an intermediate signal responsive to the input signal. The method may also include quantizing the intermediate signal into an uncompressed digital output signal. The method may further include converting the uncompressed digital output signal into an analog feedback output in order to combine the input signal and the feedback output signal at the loop filter input. The method may additionally include compressing the uncompressed digital output signal into a compressed digital output signal having fewer quantization levels than that of the uncompressed digital output signal.

In accordance with these and other embodiments of the present disclosure, an integrated circuit may include a transducer, a delta-sigma analog-to-digital converter, a digital compression circuit, and a digital processing circuit. The transducer may be configured to generate the input signal indicative of a physical quantity measured by the transducer. The delta-sigma analog-to-digital converter may include a loop filter having a loop filter input configured to receive an input signal and generate an intermediate signal responsive to the input signal, a multi-bit quantizer configured to quantize the intermediate signal into an uncompressed digital output signal, and a feedback digital-to-analog converter having a feedback output configured to generate a feedback output signal responsive to the uncompressed digital output signal in order to combine the input signal and the feedback output signal at the loop filter input. The digital compression circuit may be configured to receive the uncompressed digital output signal and compress the uncompressed digital output signal into a compressed digital output signal having fewer quantization levels than that of the uncompressed digital output signal. The digital processing circuit may be configured to process at least one of the uncompressed digital output signal and the compressed digital output signal to determine a characteristic of the input signal.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are explanatory examples and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
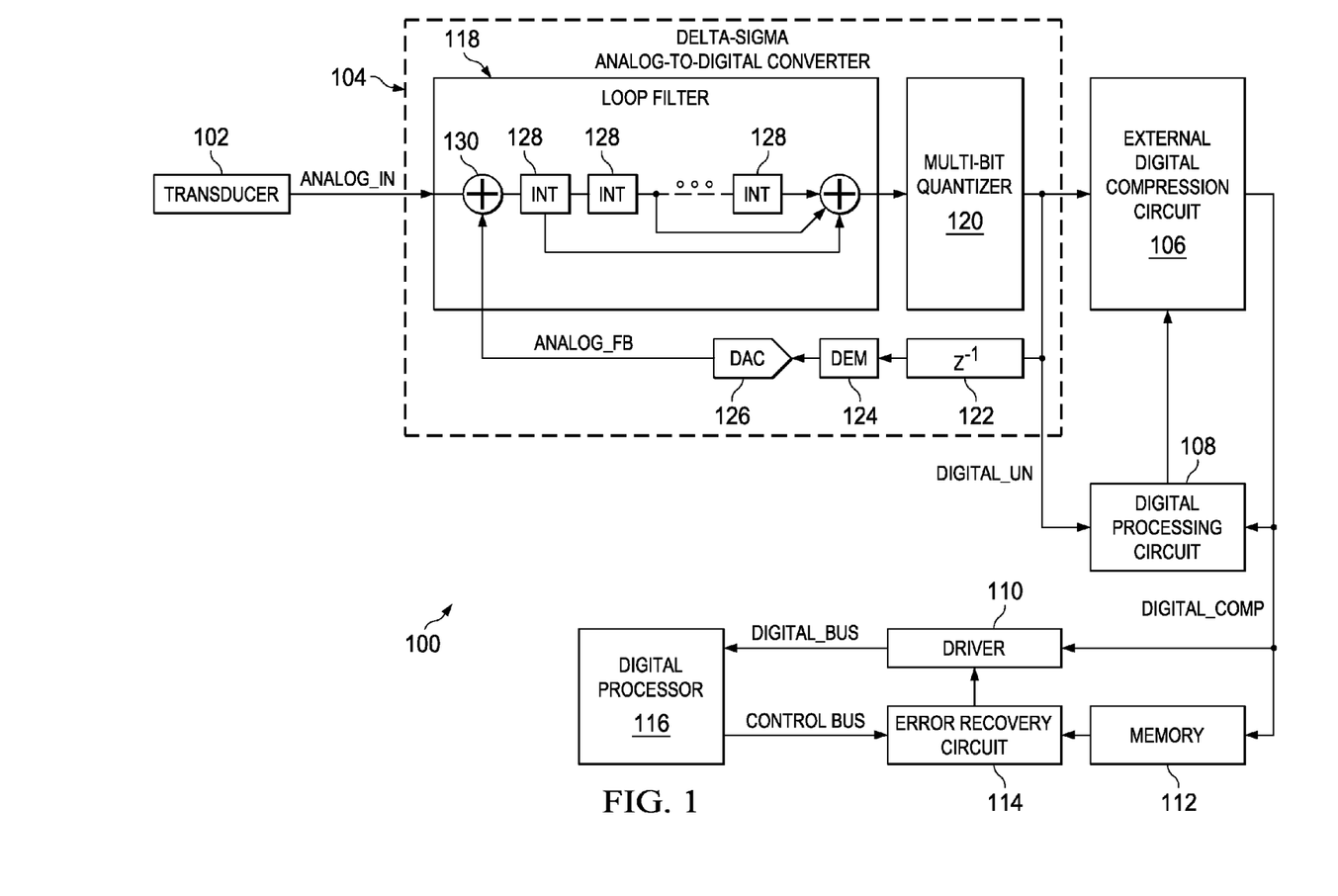
FIG. 1 illustrates a block diagram of selected components of an example system, in accordance with embodiments of the present disclosure.

FIG. 1 illustrates a block diagram of selected components of an example system 100, in accordance with embodiments of the present disclosure. As shown in FIG. 1, system 100 may include a transducer 102, a delta-sigma analog-to-digital converter (ADC) 104, an external digital compression circuit 106, a digital processing circuit 108, a driver 110, a memory 112, an error recovery circuit 114, and a digital audio processor 116.

Transducer 102 may comprise any system, device, or apparatus configured to sense a physical quantity and convert such physical quantity into an electrical analog signal ANALOG_IN indicative of such physical quantity. For example, in some embodiments, transducer 102 may comprise a microphone transducer configured to generate input signal ANALOG_IN indicative of audio sounds incident upon the microphone transducer, wherein such sound is converted to an electrical signal using a diaphragm or membrane having an electrical capacitance that varies as based on sonic vibrations received at the diaphragm or membrane. In such embodiments, transducer 102 may include an electrostatic microphone, a condenser microphone, an electret microphone, a microelectromechanical systems (MEMs) microphone, or any other suitable capacitive microphone. In other embodiments, transducer 102 may comprise seismic data acquisition equipment, such as a geophone for generating input signal ANALOG_IN indicative of acceleration sensed by the geophone.

Delta-sigma ADC 104 may comprise any suitable system device or apparatus configured to convert analog input signal ANALOG_IN received at its input, to an uncompressed digital output signal DIGITAL_UN representative of analog input signal ANALOG_IN. As shown in FIG. 1, delta-sigma ADC 104 may include a loop filter 118, a multi-bit quantizer 120, dynamic element matching circuitry (DEM) 124, a digital-to-analog converter (DAC) 126, and a delay block 122.

Loop filter 118 may comprise an input summer 130 for generating a difference between analog input signal ANALOG_IN and an analog feedback signal ANALOG_FB, and one or more integrator stages 128, such that loop filter 118 operates as an analog filter of an error signal equal to the difference between analog input signal ANALOG_IN and analog feedback signal ANALOG_FB, and generates a filtered output analog signal to multi-bit quantizer 120 based on analog input signal ANALOG_IN and analog feedback signal ANALOG_FB (e.g., the difference or error between analog input signal ANALOG_IN and analog feedback signal ANALOG_FB).

Multi-bit quantizer 120 may comprise any system, device, or apparatus configured to receive the filtered output analog signal from loop filter 118, and convert the filtered output analog signal into an uncompressed digital output signal DIGITAL_UN having a plurality of quantization levels (e.g., more than four), as is known in the art. In some embodiments, uncompressed digital output signal DIGITAL_UN may be a signal of length M, where M is a positive integer. In particular embodiments, M may be greater or equal to 3.

Digital feedback signal DIGITAL_INT may be delayed by delay block 122 and fed back through DEM circuitry 124 and DAC 126 to generate analog feedback signal ANALOG_FB.

External digital compression circuit 106 may comprise any system, device, or apparatus configured to receive uncompressed digital output signal DIGITAL_UN and compress uncompressed digital output signal DIGITAL_UN into a compressed digital output signal DIGITAL_COMP having fewer quantization levels than that of uncompressed digital output signal DIGITAL_UN, as described in greater detail elsewhere in this disclosure. For example, in some embodiments, uncompressed digital output signal DIGITAL_UN may comprise M bits and external digital compression circuit 106 may compress uncompressed digital output signal DIGITAL_UN into compressed digital output signal DIGITAL_COMP comprising N bits, where M and N are each positive integers and M is greater than N.

Figure 2:
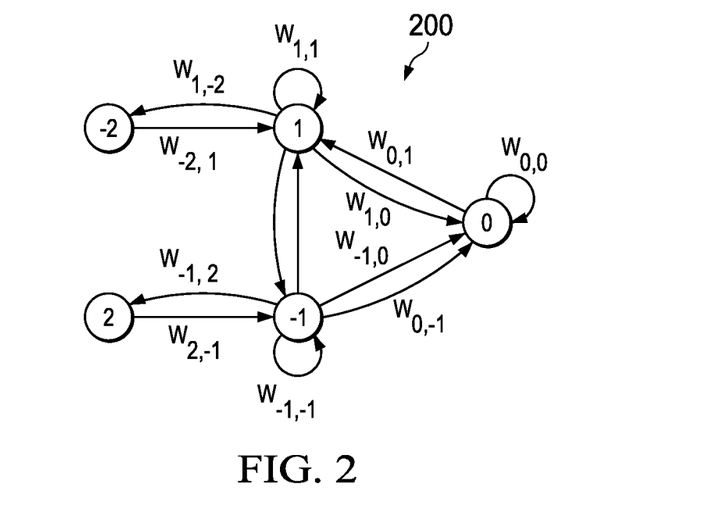
FIG. 2 illustrates an example transition graph indicative of transition statistics of a multi-bit quantizer, in accordance with embodiments of the present disclosure.

In some embodiments, a function of external digital compression circuit 106 for compressing uncompressed digital output signal DIGITAL_UN into compressed digital output signal DIGITAL_COMP is selected based on transition statistics of multi-bit quantizer 120 and uncompressed digital output signal DIGITAL_UN. For example, turning briefly to FIG. 2, depicted is an example transition graph 200 for uncompressed digital output signal DIGITAL_UN output by multi-bit quantizer 120 for an analog input signal ANALOG_IN of a particular characteristic (e.g., an audio band signal generated by a digital microphone). Nodes of transition graph 200 represent differences of quantization level in successive samples of uncompressed digital output signal DIGITAL_UN. Directed edges of transition graph 200 may represent a quantization level transition that may occur between a current sample and a most-recent sample based on the previous quantization level transition between the most-recent sample and the sample occurring immediately prior to the most-recent sample, and weights (e.g., $w_{0,0}$, $w_{0,1}$, $w_{0,-1}$, $w_{1,0}$, $w_{1,1}$, $w_{1,-1}$, $w_{1,-2}$, $w_{-1,0}$, $w_{-1,-1}$, $w_{-1,1}$, $w_{-1,2}$, $w_{2,-1}$, $w_{-2,1}$) on directed edges of transition graph may represent a probability or likelihood that a given transition may occur based on statistics of multi-bit quantizer 120 and/or the analog input signal ANALOG_IN. For example, in the example transition graph 200, when a quantization level transition of 0 occurs in uncompressed digital output signal DIGITAL_UN, the next quantization level transition may be 0, −1, or +1. Additionally, when a quantization level transition of +1 occurs in uncompressed digital output signal DIGITAL_UN, the next quantization level transition may be 0, −1, +1, or −2. Similarly, when a quantization level transition of −1 occurs in uncompressed digital output signal DIGITAL_UN, the next quantization level transition may be 0, −1, +1, or +2. Furthermore, when a quantization level transition of +2 occurs in uncompressed digital output signal DIGITAL_UN, the next quantization level transition may be −1 or −2, and when a quantization level transition of +2 occurs in uncompressed digital output signal DIGITAL_UN, the next quantization level transition may be −1, or −2. Thus, no node in transition graph 200 has more than four directed edges originating from it, and thus the various quantization levels (e.g., 16 quantization levels represented by four bits in a pulse-density modulated signal) of uncompressed digital output signal DIGITAL_UN may be encoded into two bits of transition information. The limitation of next quantization level transitions from certain present quantization level transitions may be limited due to the band-limiting nature of loop filter 118 and/or transducer 102. For example, due to the band-limiting nature of loop filter 118 and/or transducer 102, multi-bit quantizer 120 may not be instructed to increase by two quantization levels immediately after an increase by one quantization level. Accordingly, a function of external digital compression circuit 106 for compressing uncompressed digital output signal DIGITAL_UN into compressed digital output signal DIGITAL_COMP may limit possible transitions between quantization levels of uncompressed digital output signal DIGITAL_UN of consecutive samples of uncompressed digital output signal DIGITAL_UN to a subset of quantization levels of the uncompressed digital output signal DIGITAL_UN.

Thus, for an uncompressed digital output signal DIGITAL_UN having transition statistics represented by transition graph 200, external digital compression circuit 106 may have four different quantization levels, each represented by a two-bit code as shown in the following Table 1:

TABLE 1

| Transition | Description | Code |
|---|---|---|
| TOGGLE1 | Toggle between adjacent quantizer levels of DIGITAL_UN | 00 |
| HOLD | Hold the previous value of DIGITAL_UN | 11 |
| INCDEC | Increment or decrement to next higher or lower quantization level of DIGITAL_UN | 01 |
| TOGGLE2 | Toggle between quantizer levels of DIGITAL_UN differing by 2 | 10 |

In addition, for an uncompressed digital output signal DIGITAL_UN having transition statistics represented by transition graph 200, external digital compression circuit 106 may maintain a state variable DIRECTION that indicates whether the last transition was an increase or decrease of uncompressed digital output signal DIGITAL_UN. Thus, if a current sample of uncompressed digital output signal DIGITAL_UN is larger than a previous sample and the variable DIRECTION has a value "UP" indicating that the last transition was an increase of uncompressed digital output signal DIGITAL_UN, the output code corresponding to INCDEC may be output as compressed digital output signal DIGITAL_COMP as uncompressed digital output signal DIGITAL_UN is not toggling between two quantizer levels and is not holding at its current value. Similarly, if a current sample of uncompressed digital output signal DIGITAL_UN is smaller than a previous sample and the variable DIRECTION has a value "DOWN" indicating that the last transition was a decrease of uncompressed digital output signal DIGITAL_UN, the output code corresponding to INCDEC may be output as compressed digital output signal DIGITAL_COMP, as uncompressed digital output signal DIGITAL_UN is not toggling between two quantizer levels and is not holding at its current value.

For an uncompressed digital output signal DIGITAL_UN having transition statistics represented by transition graph 200 and external digital compression circuit 106 applying a function as described above with respect to Table 1, the following Table 2 sets forth an example algorithm/function applied by external digital compression circuit 106, where v[n] represents the value of the nth sample of uncompressed digital output signal DIGITAL_UN, y[n] represents a sample of compressed digital output signal DIGITAL_COMP output in response to receipt of v[n], and DIRECTION[n] represents the value of DIRECTION calculated in response to receipt of v[n]:

TABLE 2

| v[n] − v[n − 1] | DIRECTION[n − 1] | y[n] | DIRECTION[n] |
|---|---|---|---|
| 0 | DOWN | HOLD | DOWN |
| 0 | UP | HOLD | UP |

TABLE 2-continued

| v[n] − v[n − 1] | DIRECTION[n − 1] | y[n] | DIRECTION[n] |
|---|---|---|---|
| −1 | DOWN | TOGGLE1 | DOWN |
| −1 | UP | INCDEC | DOWN |
| +1 | DOWN | INCDEC | UP |
| +1 | UP | TOGGLE1 | UP |
| −2 | DOWN | TOGGLE2 | DOWN |
| +2 | UP | TOGGLE2 | UP |

Different but similar algorithms/functions may be applied to multi-bit quantizers 120 having more quantization levels and/or to an uncompressed digital output signal DIGITAL_UN having different transition statistics than that shown above. Furthermore, such different but similar algorithms/functions may provide for additional quantization levels for compressed digital output signal DIGITAL_COMP beyond those described above (e.g., output codes corresponding to transitions of INCDEC2, INCDEC3, TOGGLE3, TOGGLE4, etc.). Thus, a function of external digital compression circuit 106 for compressing uncompressed digital output signal DIGITAL_UN into compressed digital output signal DIGITAL_COMP may be selected based on transition statistics of the multi-bit quantizer.

Also, as seen above, for each given sample of uncompressed digital output signal DIGITAL_UN, external digital compression circuit 106 may generate a corresponding sample of compressed digital output signal DIGITAL_COMP based on transition statistics of multi-bit quantizer 120. For example, in the example above, a sample of compressed digital output signal DIGITAL_COMP generated in response to receipt of uncompressed digital output signal DIGITAL_UN may be based on not only the corresponding sample of uncompressed digital output signal DIGITAL_UN, but also on a previous sample of uncompressed digital output signal DIGITAL_UN, as represented by the state variable DIRECTION. However, different but similar algorithms/functions may be applied to multi-bit quantizers 120 having more quantization levels and/or to an uncompressed digital output signal DIGITAL_UN having different transition statistics than that shown above to generate compressed digital output signal DIGITAL_COMP based on more than the two most recent samples of uncompressed digital output signal DIGITAL_UN.

In some embodiments, a function of external digital compression circuit 106 for compressing the uncompressed digital output signal into a compressed digital output signal is selected based on transition statistics of multi-bit quantizer 120 in order to minimize transition frequency of the N bits of external digital compression circuit 106. For example, if the transition statistics indicate that compressed digital output signal DIGITAL_COMP indicates transitions of HOLD and TOGGLE1 a substantial percentage of the time, a function of external digital compression circuit 106 may provide that the output codes for HOLD and TOGGLE1 are such that only one bit of compressed digital output signal DIGITAL_COMP transitions when the transition indicated by digital output signal DIGITAL_COMP changes from HOLD to TOGGLE1 or vice versa. Thus, in this example, if HOLD were represented by a code "00," TOGGLE1 may be represented by output code "01" or "10," such that only one bit of compressed digital output signal DIGITAL_COMP transitions when the transition indicated by digital output signal DIGITAL_COMP changes from HOLD to TOGGLE1 or vice versa. By minimizing the number of transitions of compressed digital output signal DIGITAL_

COMP in this manner, power consumption associated with generating and transmitting digital output signal DIGITAL_COMP may be minimized.

Furthermore, in these and other embodiments, a function of external digital compression circuit 106 may limit possible transitions between quantization levels of uncompressed digital output signal DIGITAL_UN of consecutive samples of the uncompressed digital output signal DIGITAL_UN, as described above, such that compression is lossless (e.g., the signal reconstructed by digital processor 116 is equivalent to the uncompressed digital output signal DIGITAL_UN). In other embodiments in which compression is not lossless, limiting possible transitions between quantization levels of uncompressed digital output signal DIGITAL_UN of consecutive samples of the uncompressed digital output signal DIGITAL_UN may also minimize degradation to the signal such that compression artifacts are minimal or are outside a frequency band of interest (e.g., outside the range of human hearing).

In some embodiments, the function applied by external digital compression circuit 106 to compress uncompressed digital output signal DIGITAL_UN into compressed digital output signal DIGITAL_COMP may be static and determined based on characterization and testing of system 100 or portions thereof prior to packaging or shipment to an intended end user, using waveforms for analog input signal ANALOG_IN expected for the type of application in which system 100 is to be used. In other embodiments, functions may be dynamically selected by digital processing circuit 108 based on characteristics of analog input signal ANALOG_IN, as described below.

Turning again to FIG. 1, digital processing circuit 108 may comprise any system, device, or apparatus configured to process at least one of uncompressed digital output signal DIGITAL_UN and compressed digital output signal DIGITAL_COMP to determine a characteristic of analog input signal ANALOG_IN. For example, in some embodiments in which transducer 102 comprises a microphone, digital processing circuit 108 may process at least one of uncompressed digital output signal DIGITAL_UN and compressed digital output signal DIGITAL_COMP to perform voice detection (e.g., detection of a particular individual's voice and/or detection of particular words of phrases uttered by an individual). In these and other embodiments in which transducer 102 comprises a microphone, digital processing circuit 108 may process at least one of uncompressed digital output signal DIGITAL_UN and compressed digital output signal DIGITAL_COMP to determine mel-frequency cepstral coefficients of the input signal, which may aid in performance of voice detection. In these and other embodiments in which transducer 102 comprises a microphone, digital processing circuit 108 may process at least one of uncompressed digital output signal DIGITAL_UN and compressed digital output signal DIGITAL_COMP to detect the presence of ultrasonic energy in the input signal (e.g., spectral energy above the range of human hearing).

While the foregoing discussion contemplates processing of signals indicative of speech, the systems and methods described herein may be applied to any type of signal, whether speech, music, other audio signals, ultrasonic signals, or infrasonic signals.

In these and other embodiments, digital processing circuit 108 may be configured to control external digital compression circuit 106 to set a number of bits comprising compressed digital output signal DIGITAL_COMP based on the sensed or detected characteristic of analog input signal ANALOG_IN. For instance, digital processing circuit 108 may be configured to set the number of bits to a first number if the input signal has energy above a particular frequency (e.g., ultrasonic) and set the number of bits to a second number if the input signal lacks energy above the particular frequency (e.g., sonic). Thus, for ultrasonic energy, external digital compression circuit 106 may use a lower compression ratio than for a signal with wholly sonic energy.

Driver 110 may receive the digital signal DIGITAL_COMP output by external digital compression system 106 and may comprise any suitable system, device, or apparatus configured to condition such digital signal (e.g., encoding into Audio Engineering Society/European Broadcasting Union (AES/EBU), Sony/Philips Digital Interface Format (S/PDIF)), in the process generating digital output signal DIGITAL_BUS for transmission over a bus to digital processor 116. In FIG. 1, the bus receiving digital output signal DIGITAL_BUS is shown as single-ended. In some embodiments, driver 110 may generate a differential digital audio output signal.

Memory 112 may comprise any system, device, or apparatus configured to retain program instructions and/or data for a period of time (e.g., computer-readable media). Memory 112 may include RAM, EEPROM, a PCMCIA card, flash memory, magnetic storage, opto-magnetic storage, or any suitable selection and/or array of volatile or non-volatile memory that retains data after power to system 100 or portions thereof is turned off. In operation in system 100, memory 112 may be configured to store one or more compressed digital samples of the compressed digital output signal in order of transmission as transmitted from driver 110. Accordingly, memory 112 may be coupled to error recovery circuit 114, which may be configured to, in response to an error in transmission of digital output signal DIGITAL_BUS, read the one or more compressed samples from memory 104 and cause driver 110 to re-transmit the one or more compressed digital samples. In some embodiments, error recovery circuit 114 may determine a transmission error has occurred and/or the nature of such transmission error based on one or more control signals communicated from a control bus between digital processor 116 and error recovery circuit 114.

Digital processor 116 may comprise any suitable system, device, or apparatus configured to process digital output signal DIGITAL_BUS for use in a digital system (e.g., an audio system). For example, digital processor 116 may comprise a microprocessor, microcontroller, digital signal processor (DSP), application specific integrated circuit (ASIC), or any other device configured to interpret and/or execute program instructions and/or process data, such as a digital audio output signal. In some embodiments, digital processor 116 may receive the digital signal DIGITAL_BUS and reconstruct a digital signal with the same number of quantization levels as uncompressed digital output signal DIGITAL_UN by applying a function which is a dual or inverse of that of external digital compression circuit 106. Accordingly, in embodiments in which digital processing circuit 108 may dynamically change a function applied by external digital compression circuit 106, one or more components of system 100 may be configured to communicate one or more control signals to digital processor 116 indicative of such change in compression function such that digital processor 116 may cause a corresponding change to its decompression function.

A change in compression function may be communicated to the digital processor 116 via an interrupt issued to the digital processor 116 or through some other side channel communication. In some systems, activating an interrupt or communicating through a side channel may be virtually free as the system would be configured to service interrupts, regardless of whether or not the data is being compressed. An example of such a system is a digital microphone communicating over a Soundwire™ serial link to a digital processor 116. In such a system the microphone utilizes features of the Soundwire™ bus protocol to interrupt digital processor 116 to change its compression without the need for an additional pin on the microphone or an additional communication channel into digital processor 116.

Other systems may lack the ability to send side channel information for virtually free as in the Soundwire™ example described above. In such systems, the need to communicate a change in compression ratio may actually place an undue burden on the system. That is, the cost of communicating the change in compression ratio may mitigate the advantages of compression in the first place. In some systems, it may be acceptable to have inexact recovery at the digital processor 116. For systems that need a constant compression ratio and can tolerate some amount of signal degradation, the embodiment in FIG. 4, described in greater detail below, may be preferred.

In some embodiments of system 100, transducer 102, delta-sigma ADC 104, and external digital compression circuit 106 may be formed on a single substrate (e.g., the same semiconductor substrate). In other embodiments of system 100, transducer 102, delta-sigma ADC 104, and external digital compression circuit 106 may be formed on different substrates packaged within the same integrated circuit package.

Figure 3A:
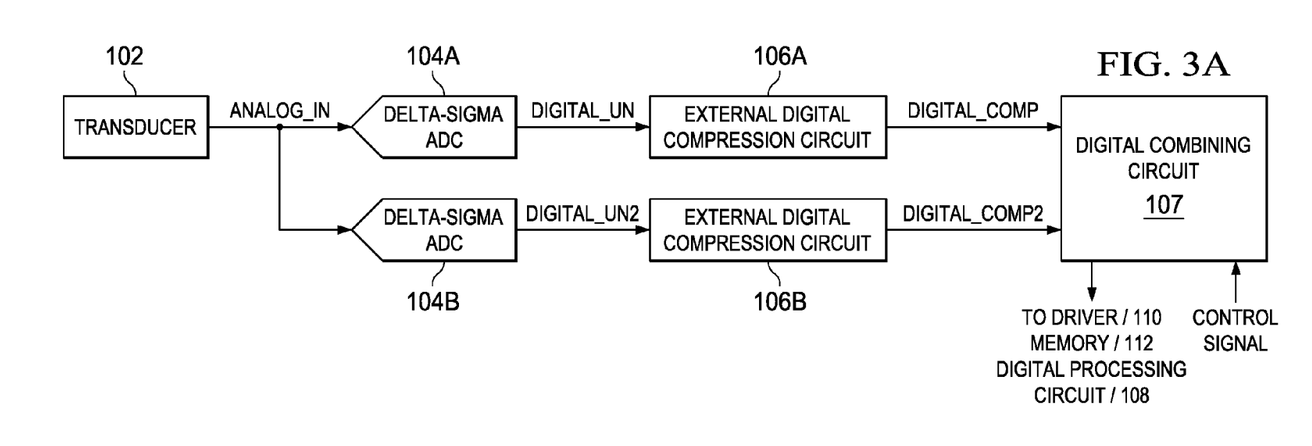
FIGS. 3A and 3B each illustrates a block diagram of selected components that may be used in lieu of a portion of the system displayed in FIG. 1.

FIG. 3A illustrates a block diagram of selected components that may be used in lieu of a portion of system 100, in accordance with embodiments of the present disclosure. As shown in FIG. 3A, delta-sigma ADC 104 may be replaced with two delta-sigma ADCs 104A and 104B. In addition, external digital compression circuit 106 may be replaced with two external digital compression circuits 106A and 106B.

Each delta-sigma ADC 104A and 104B may include components (e.g., loop filter 118, multi-bit quantizer 120, delay block 122, DEM circuitry 124, and feedback DAC 126) as shown in FIG. 1 for delta-sigma ADC 104. As shown in FIG. 3A, delta-sigma ADCs 104A and 104B may each convert analog input signal ANALOG_IN into respective uncompressed digital output signals DIGITAL_UN and DIGITAL_UN2. Each of uncompressed digital output signals DIGITAL_UN and DIGITAL_UN2 may be input to a respective external digital compression circuit 106A and 106B for compressing each of uncompressed digital output signals DIGITAL_UN and DIGITAL_UN2 into respective compressed digital output signals DIGITAL_COMP and DIGITAL_COMP2, in a manner similar or identical to that described above with respect to external digital compression circuit 106. The compressed digital output signals DIGITAL_COMP and DIGITAL_COMP2 may be combined by a digital combining circuit 107, with the resulting signal communicated to driver 110, memory 112, digital processing circuit 108, and/or other components of system 100 in a manner identical or similar to that of compressed digital output signal DIGITAL_COMP depicted in FIG. 1. As shown in FIG. 3A, digital combining circuit 107 may receive a control signal (e.g., from digital processing circuit 108 or other source) which may select between digital output signals DIGITAL_COMP and DIGITAL_COMP2 or indicate respective weights of digital output signals DIGITAL_COMP and DIGITAL_COMP2 to be applied to the output signal generated by digital combining circuit 107. In some embodiments, the control signal may be indicative of a magnitude of analog input signal ANALOG_IN or a signal derivative therefrom.

Figure 3B:
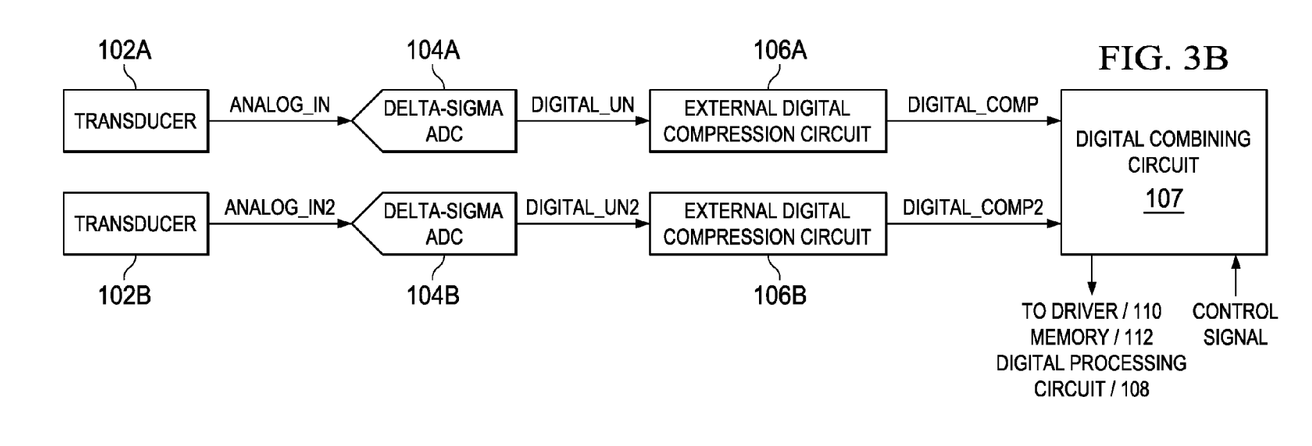

FIG. 3B illustrates a block diagram of selected components that may be used in lieu of a portion of system 100, in accordance with embodiments of the present disclosure. FIG. 3B is similar to that of FIG. 3A, except that transducer 102 is replaced with two transducers 102A and 102B, which each produce respective analog input signals ANALOG_IN and ANALOG_IN2. As shown in FIG. 3B, delta-sigma ADCs 104A and 104B may each convert their respective analog input signals ANALOG_IN and ANALOG_IN2 into respective uncompressed digital output signals DIGITAL_UN and DIGITAL_UN2. Each of uncompressed digital output signals DIGITAL_UN and DIGITAL_UN2 may be input to a respective external digital compression circuit 106A and 106B for compressing each of uncompressed digital output signals DIGITAL_UN and DIGITAL_UN2 into respective compressed digital output signals DIGITAL_COMP and DIGITAL_COMP2, in a manner similar or identical to that described above with respect to external digital compression circuit 106. The compressed digital output signals DIGITAL_COMP and DIGITAL_COMP2 may be combined by a digital combining circuit 107, with the resulting signal communicated to driver 110, memory 112, digital processing circuit 108, and/or other components of system 100 in a manner identical or similar to that of compressed digital output signal DIGITAL_COMP depicted in FIG. 1.

In each of FIGS. 3A and 3B, external digital compression circuit 106A may be configured to receive uncompressed digital output signal DIGITAL_UN having M bits and compress uncompressed digital output signal DIGITAL_UN into compressed digital output signal DIGITAL_COMP having N bits, wherein M and N are each positive integers and M>N. Similarly, external digital compression circuit 106B may be configured to receive uncompressed digital output signal DIGITAL_UN having Y bits and compress uncompressed digital output signal DIGITAL_UN into compressed digital output signal DIGITAL_COMP having Z bits, wherein Y and Z are each positive integers and Y>Z. In some embodiments, M=Y. In these and other embodiments, N=Z.

The approaches of FIGS. 3A and 3B may be used to perform dual-path or multi-path dynamic range enhancement in a system. For example, the dynamic range of transducer 102 or system 100 in general may be extended by having the multiple processing paths each having a respective gain, and selecting one or the paths or combining the paths in a manner to provide a wider dynamic range than one path along might provide.

Figure 4:
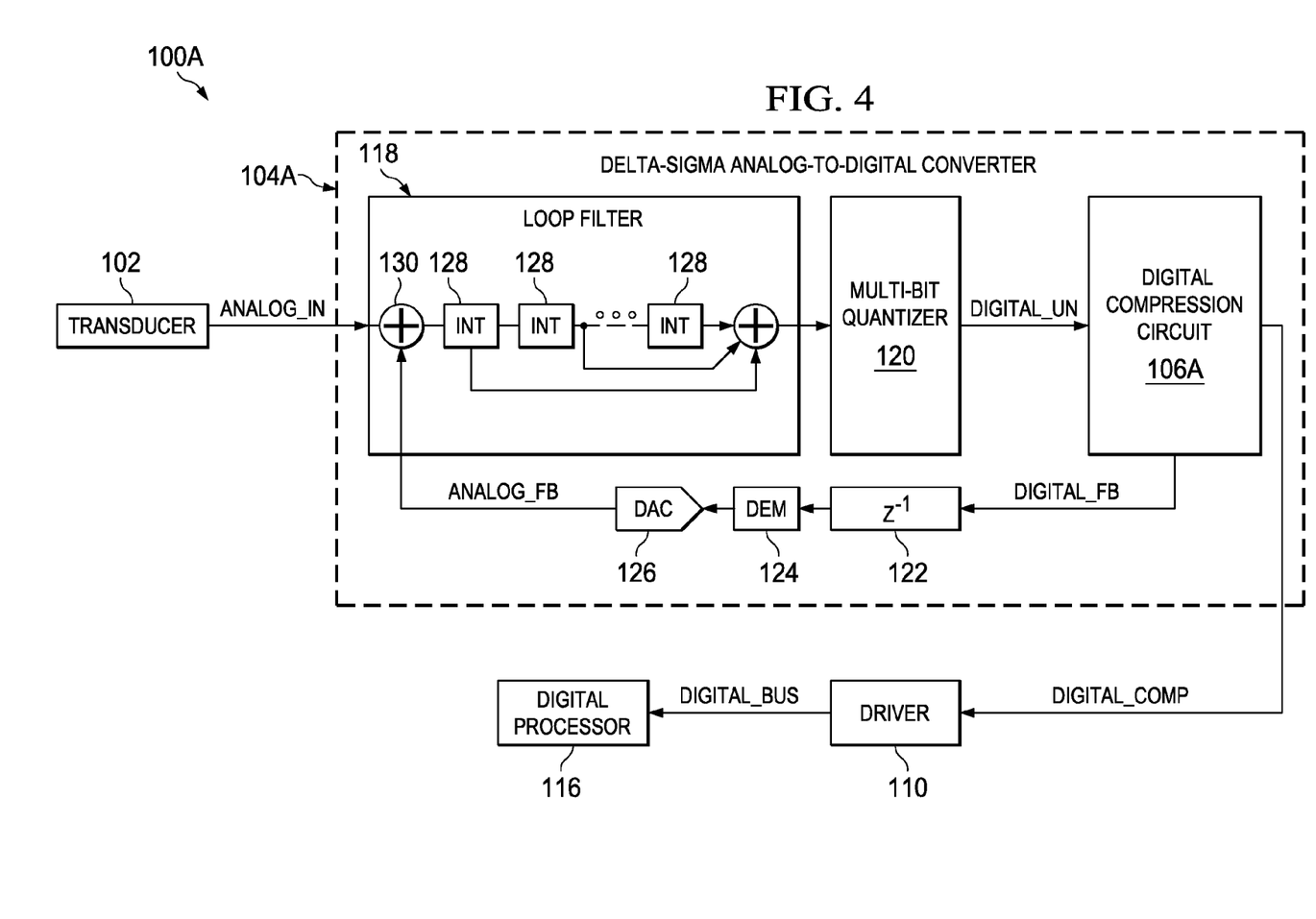
FIG. 4 illustrates a block diagram of selected components of another example system, in accordance with embodiments of the present disclosure.

FIG. 4 illustrates a block diagram of selected components of another example system 100A, in accordance with embodiments of the present disclosure, which may be used as an alternative to system 100 of FIG. 1. FIG. 4 may be similar to FIG. 1 in that it may include a transducer 102, a delta-sigma ADC 104A, and a digital compression circuit 106A similar in structure and/or function to transducer 102, delta-sigma ADC 104, and digital compression circuit 106 of FIG. 1, except as described below.

As shown in FIG. 4, delta-sigma ADC 104A may differ from delta-sigma ADC 104 in that digital compression circuit 106A is internal to delta-sigma ADC 104A and may, in addition to compressing uncompressed digital output signal DIGITAL_UN into compressed digital output signal DIGITAL_COMP as does digital compression circuit 106 of FIG. 1, digital compression circuit 106A may also generate a digital feedback signal DIGITAL_FB indicative of the generated compressed digital output signal DIGITAL_COMP. For example, the compression function of digital compression circuit 106A may be limited in the magnitude of transitions of uncompressed digital output signal DIGITAL_UN that it may represent, and if a magnitude of transition of uncompressed digital output signal DIGITAL_UN is other than that which can accurately be represented by compressed digital output signal DIGITAL_COMP, compressed digital output signal DIGITAL_COMP may simply estimate the transition in accordance with its limited set of output codes. For example, if successive samples of uncompressed digital output signal DIGITAL_UN are 5 and 9, but digital compression circuit 106A is only capable of outputting digital codes for compressed digital output signal DIGITAL_COMP that represent a maximum of a change in magnitude of 2 for uncompressed digital output signal DIGITAL_UN, digital compression circuit 106A may simply output the digital code corresponding to an increase of 2 of the magnitude of uncompressed digital output signal DIGITAL_UN. In addition, digital compression circuit 106A may output digital feedback signal DIGITAL_FB indicative of the magnitude of uncompressed digital output signal DIGITAL_UN represented by compressed digital output signal DIGITAL_COMP. Thus, in the present example in which successive samples of uncompressed digital output signal DIGITAL_UN are 5 and 9 and digital compression circuit 106A outputs the digital code corresponding to an increase of 2 of the magnitude of uncompressed digital output signal DIGITAL_UN, digital compression circuit 106A may output digital feedback signal DIGITAL_FB with a value of 7 (i.e., the previous sample for uncompressed digital output signal DIGITAL_UN of 5 plus the change in magnitude of 2 indicated by compressed digital output signal DIGITAL_COMP).

In some instances, the embodiments represented by FIG. 4 may be preferred over the embodiments represented by FIG. 1, as system 100A may not require memory 112 nor error recovery circuit 114 as does system 100 of FIG. 1. In addition, system 100A may be capable of operating with a fixed compression ratio under all input conditions with an acceptable amount of signal degradation.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

What is claimed is:

1. A system comprising: a delta-sigma analog-to-digital converter comprising:
    a loop filter having a loop filter input configured to receive an input signal and generate an intermediate signal responsive to the input signal;
    a multi-bit quantizer configured to quantize the intermediate signal into an uncompressed digital output signal;
    and a feedback digital-to-analog converter having a feedback output configured to generate a feedback output signal responsive to the uncompressed digital output signal in order to combine the input signal and the feedback output signal at the loop filter input;
    and a digital compression circuit configured to receive the uncompressed digital output signal and compress the uncompressed digital output signal into a compressed digital output signal having fewer quantization levels than that of the uncompressed digital output signal,
    wherein for each given sample of the uncompressed digital output signal, the digital compression circuit generates a corresponding sample of the compressed digital output signal based on at least a first quantization level transition between the given sample and a first previous sample sampled consecutively previous to the given sample and a second quantization level transition between the first previous sample and a second previous sample sampled consecutively previous to the first previous sample.

2. The system of claim 1, wherein: the uncompressed digital output signal comprises M bits; the compressed digital output signal comprises N bits; and M and N are each positive integers and M>N.

3. The system of claim 1, wherein for each given sample of the uncompressed digital output signal, the digital compression circuit generates a corresponding sample of the compressed digital output signal based on transition statistics of the multi-bit quantizer.

4. The system of claim 1, wherein a function of the digital compression circuit for compressing the uncompressed digital output signal into the compressed digital output signal is selected based on transition statistics of the multi-bit quantizer in order to minimize transition frequency of bits making up the compressed digital output signal.

5. The system of claim 1, wherein a function of the digital compression circuit for compressing the uncompressed digital output signal into the compressed digital output signal limits possible transitions between quantization levels of the uncompressed digital output signal of consecutive samples of the uncompressed digital output signal to a subset of the quantization levels of the uncompressed digital output signal.

6. The system of claim 5, wherein the function limits possible transitions between quantization levels of the uncompressed digital output signal of consecutive samples of the uncompressed digital output signal in order to minimize degradation to the compressed digital output signal.

7. The System of claim 1, further comprising a transducer configured to generate the input signal.

8. The system of claim 7, wherein the transducer comprises a microphone transducer configured to generate the input signal indicative of audio sounds incident upon the microphone transducer.

9. The system of claim 8, wherein the microphone transducer, the digital-to analog converter, and the digital compression circuit are formed on a single substrate.

10. The system of claim 8, wherein the microphone transducer, the digital-to analog converter, and the digital compression circuit are formed on different substrates packaged within the same integrated circuit package.

11. The system of claim 8, wherein the microphone transducer comprises a microelectromechanical systems microphone.

12. The system of claim 7, wherein the transducer comprises seismic data acquisition equipment.

13. The system of claim 1, further comprising a processing circuit for decompressing the compressed digital output signal.

14. The system of claim 1, further comprising: a driver configured to transmit the compressed digital output signal; a memory configured to store one or more transmitted compressed digital samples of the compressed digital output signal in order of transmission; and an error recovery circuit configured to cause the driver to re-transmit the one or more transmitted compressed digital samples in response to an error in transmission of the compressed digital output signal.

15. The system of claim 1, wherein the multi-bit quantizer limits possible transitions between quantization levels of the uncompressed digital output signal of consecutive samples of the uncompressed digital output signal to a subset of the quantization levels of the uncompressed digital output signal.

16. The system of claim 1, wherein the digital compression circuit is external to the delta-sigma analog-to-digital converter.

17. The system of claim 1, wherein the digital compression circuit is internal to the delta-sigma analog-to-digital converter and wherein the feedback digital-to-analog converter is configured to generate the feedback output signal responsive to the uncompressed digital output signal and the compressed digital output signal in order to combine the input signal and the feedback output signal at the loop filter input.

18. A method comprising:
receiving an input signal at a loop filter input and filtering the input signal to generate an intermediate signal responsive to the input signal;
quantizing the intermediate signal into an uncompressed digital output signal; generating an analog feedback output responsive to the uncompressed digital output signal in order to combine the input signal and the feedback output signal at the loop filter input;
compressing the uncompressed digital output signal into a compressed digital output signal having fewer quantization levels than that of the uncompressed digital output signal;
and for each given sample of the uncompressed digital output signal, generating a corresponding sample of the compressed digital output signal based on at least a first quantization level transition between the given sample and a first previous sample sampled consecutively previous to the given sample and a second quantization level transition between the first previous sample and a second previous sample sampled consecutively previous to the first previous sample.

19. The method of claim 18, wherein:
the uncompressed digital output signal comprises M bits;
the compressed digital output signal comprises N bits;
and M and N are each positive integers and M>N.

20. The method of claim 18, further comprising, for each given sample of the uncompressed digital output signal, generating a corresponding sample of the compressed digital output signal based on transition statistics of the multi-bit quantizer.

21. The method of claim 18, wherein a function for compressing the uncompressed digital output signal into the compressed digital output signal is selected based on transition statistics of the multi-bit quantizer in order to minimize transition frequency of bits making up the compressed digital output signal.

22. The method of claim 18, wherein a function for compressing the uncompressed digital output signal into the compressed digital output signal limits possible transitions between quantization levels of the uncompressed digital output signal of consecutive samples of the uncompressed digital output signal to a subset of the quantization levels of the uncompressed digital output signal.

23. The method of claim 22, wherein the function limits possible transitions between quantization levels of the uncompressed digital output signal of consecutive samples of the uncompressed digital output signal in order to minimize degradation to the compressed digital output signal.

24. The method of claim 18, wherein the analog input signal is generated by a transducer.

25. The method of claim 24, wherein the transducer comprises a microphone transducer configured to generate the input signal indicative of audio sounds incident upon the microphone transducer.

26. The method of claim 25, wherein the microphone transducer comprises a microelectromechanical systems microphone.

27. The method of claim 24, wherein the transducer comprises seismic data acquisition equipment.

28. The method of claim 18, further comprising a processing circuit for decompressing the compressed digital output signal.

29. The method of claim 18, further comprising: transmitting the compressed digital output signal; storing one or more transmitted compressed digital samples of the compressed digital output signal in order of transmission; and re-transmitting the one or more transmitted compressed digital samples in response to an error in transmission of the compressed digital output signal.

30. The method of claim 18, further comprising processing at least one of the uncompressed digital output signal and the compressed digital output signal to determine a characteristic of the input signal.

31. The method of claim 30, further comprising processing at least one of the uncompressed digital output signal and the compressed digital output signal to perform voice detection.

32. The method of claim 30, further comprising processing at least one of the uncompressed digital output signal and the compressed digital output signal to detect the presence of ultrasonic energy in the input signal.

33. The method of claim 30, further comprising processing at least one of the uncompressed digital output signal and the compressed digital output signal to determine mel-frequency cepstral coefficients of the input signal.

34. The method of claim 30, further comprising determining a number of bits comprising the compressed digital output signal based on the characteristic of the input signal.

35. The method of claim 30, further comprising setting the number of bits to a first number if the input signal has energy above a particular frequency and setting the number of bits to a second number if the input signal lacks energy above the particular frequency.

36. The method of claim 18, further comprising generating the analog feedback output responsive to the uncompressed digital output signal and the compressed digital output signal.

37. An integrated circuit comprising: a transducer configured to generate an input signal indicative of a physical quantity measured by the transducer;
a delta-sigma analog-to-digital converter comprising: a loop filter having a loop filter input configured to receive an input signal and generate an intermediate signal responsive to the input signal;
a multi-bit quantizer configured to quantize the intermediate signal into an uncompressed digital output signal;
and a feedback digital-to-analog converter having a feedback output configured to generate a feedback output signal responsive to the uncompressed digital output signal in order to combine the input signal and the feedback output signal at the loop filter input;
a digital compression circuit configured to receive the uncompressed digital output signal and compress the uncompressed digital output signal into a compressed digital output signal having fewer quantization levels than that of the uncompressed digital output signal,
wherein for each given sample of the uncompressed digital output signal, the digital compression circuit generates a corresponding sample of the compressed digital output signal based on at least a first quantization level transition between the given sample and a first previous sample sampled consecutively previous to the given sample and a second quantization level transition between the first previous sample and a second previous sample sampled consecutively previous to the first previous sample;
and a digital processing circuit for processing at least one of the uncompressed digital output signal and the compressed digital output signal to determine a characteristic of the input signal.

38. The integrated circuit of claim 37, wherein: the uncompressed digital output signal comprises M bits; the compressed digital output signal comprises N bits; and M and N are each positive integers and M>N.

39. The integrated circuit of claim 37, wherein the digital processing circuit processes at least one of the uncompressed digital output signal and the compressed digital output signal to perform voice detection.

40. The integrated circuit of claim 37, wherein the digital processing circuit processes at least one of the uncompressed digital output signal and the compressed digital output signal to detect the presence of ultrasonic energy in the input signal.

41. The integrated circuit of claim 37, wherein the digital processing circuit processes at least one of the uncompressed digital output signal and the compressed digital output signal to determine mel-frequency cepstral coefficients of the input signal.

42. The integrated circuit of claim 37, wherein the transducer comprises a microphone transducer configured to generate the input signal indicative of audio sounds incident upon the microphone transducer.

43. The integrated circuit of claim 42, wherein the microphone transducer, the digital-to-analog converter, and the digital compression circuit are formed on a single substrate.

44. The integrated circuit of claim 42, wherein the microphone transducer, the digital-to-analog converter, and the digital compression circuit are formed on different substrates packaged within the same integrated circuit package.

45. The integrated circuit of claim 42, wherein the microphone transducer comprises a microelectromechanical systems microphone.

46. The integrated circuit of claim 42, wherein the transducer comprises seismic data acquisition equipment.

47. The integrated circuit of claim 37, wherein the digital processing circuit is configured to set a number of bits comprising the compressed digital output signal based on the characteristic of the input signal.

48. The integrated circuit of claim 47, wherein the digital processing circuit is configured to set the number of bits to a first number if the input signal has energy above a particular frequency and set the number of bits to a second number if the input signal lacks energy above the particular frequency.

49. The integrated circuit of claim 37, further comprising a second delta-sigma analog-to-digital converter comprising: a second loop filter having a second loop filter input configured to receive one of the input signal and a second input signal and generate a second intermediate signal responsive to the one of the input signal and the second input signal;
a second multi-bit quantizer configured to quantize the second intermediate signal into a second uncompressed digital output signal having Y bits; and a second feedback digital-to-analog converter having a second feedback output configured to generate a second feedback output signal responsive to the second uncompressed digital output signal in order to combine the second feedback output signal and the one of the input signal and the second input signal at the loop filter input;
a second digital compression circuit configured to receive the second uncompressed digital output signal and compress the second uncompressed digital output signal into a second compressed digital output signal having Z bits, wherein Y and Z are each positive integers and Y>Z; and a summing element for summing the compressed digital output signal and the second compressed digital output signal.

50. The integrated circuit of claim 49, wherein M=Y.

51. The integrated circuit of claim 49, wherein N=Z.

52. The integrated circuit of claim 49, further comprising a second transducer configured to generate the second input signal indicative of a second physical quantity measured by the second transducer, and wherein the one of the input signal and the second input signal comprises the second input signal.

53. The integrated circuit of claim 37, wherein the digital compression circuit is external to the delta-sigma analog-to-digital converter.

54. The integrated circuit of claim 37, wherein the digital compression circuit is internal to the delta-sigma analog-to-digital converter and wherein the feedback digital-to analog converter is configured to generate the feedback output signal responsive to the uncompressed digital output signal and the compressed digital output signal in order to combine the input signal and the feedback output signal at the loop filter input.

* * * * *

UNITED STATES PATENT AND TRADEMARK OFFICE
CERTIFICATE OF CORRECTION

PATENT NO. : 9,626,981 B2
APPLICATION NO. : 14/745795
DATED : April 18, 2017
INVENTOR(S) : Chesney It is certified that error appears in the above-identified patent and that said Letters Patent is hereby corrected as shown below:

On the Title Page

Please delete title page and insert the attached title page.

In the Drawings

Please replace Drawing Sheet 2 of 4 with Replacement Drawing Sheet 2 of 4 attached hereto.

In the Specification

Please amend the paragraph beginning at Line 15 of Column 4 as follows:
In some embodiments, a function of external digital compression circuit 106 for compressing uncompressed digital output signal DIGITAL_UN into compressed digital output signal DIGITAL_COMP is selected based on transition statistics of multi-bit quantizer 120 and uncompressed digital output signal DIGITAL_UN. For example, turning briefly to FIGURE 2, depicted is an example transition graph 200 for uncompressed digital output signal DIGITAL_UN output by multi-bit quantizer 120 for an analog input signal ANALOG_IN of a particular characteristic (e.g., an audio band signal generated by a digital microphone). Nodes of transition graph 200 represent differences of quantization level in successive samples of uncompressed digital output signal DIGITAL_UN. Directed edges of transition graph 200 may represent a quantization level transition that may occur between a current sample and a most-recent sample based on the previous quantization level transition between the most-recent sample and the sample occurring immediately prior to the most-recent sample, and weights (e.g., $w_{0,0}$, $w_{0,1}$, $w_{0,-1}$, $W_{1,0}$, $W_{1,1}$, $W_{1,-1}$, $W_{1,-2}$, $W_{-1,0}$, $W_{-1,-1}$, $W_{-1,1}$, $W_{-1,2}$, $W_{2,-1}$, $W_{-2,1}$) on directed edges of transition graph may represent a probability or likelihood that a given transition may occur based on statistics of multi-bit quantizer 120 and/or the analog input signal ANALOG_IN. For example, in the example transition graph 200, when a quantization level transition of 0 occurs in uncompressed digital output signal DIGITAL_UN, the next quantization level transition may be 0, -1, or +1. Additionally, when a quantization level Signed and Sealed this
Tenth Day of July, 2018

Andrei Iancu
*Director of the United States Patent and Trademark Office*

CERTIFICATE OF CORRECTION (continued)
U.S. Pat. No. 9,626,981 B2 transition of +1 occurs in uncompressed digital output signal DIGITAL_UN, the next quantization level transition may be 0, -1, +1, or -2. Similarly, when a quantization level transition of -1 occurs in uncompressed digital output signal DIGITAL_UN, the next quantization level transition may be 0, -1, +1, or +2. Furthermore, when a quantization level transition of +2 occurs in uncompressed digital output signal DIGITAL_UN, the next quantization level transition may be -1, and when a quantization level transition of -2 occurs in uncompressed digital output signal DIGITAL_UN, the next quantization level transition may be 1. Thus, no node in transition graph 200 has more than four directed edges originating from it, and thus the various quantization levels (e.g., 16 quantization levels represented by four bits in a pulse-density modulated signal) of uncompressed digital output signal DIGITAL_UN may be encoded into two bits of transition information. The limitation of next quantization level transitions from certain present quantization level transitions may be limited due to the band-limiting nature of loop filter 118 and/or transducer 102. For example, due to the band-limiting nature of loop filter 118 and/or transducer 102, multi-bit quantizer 120 may not be instructed to increase by two quantization levels immediately after an increase by one quantization level. Accordingly, a function of external digital compression circuit 106 for compressing uncompressed digital output signal DIGITAL_UN into compressed digital output signal DIGITAL_COMP may limit possible transitions between quantization levels of uncompressed digital output signal DIGITAL_UN of consecutive samples of uncompressed digital output signal DIGITAL_UN to a subset of quantization levels of the uncompressed digital output signal DIGITAL_UN.

(12) United States Patent
Chesney

(10) Patent No.: US 9,626,981 B2
(45) Date of Patent: Apr. 18, 2017

(54) SYSTEMS AND METHODS FOR COMPRESSING A DIGITAL SIGNAL

(71) Applicant: Cirrus Logic, Inc., Austin, TX (US)

(72) Inventor: Brian Parker Chesney, Bee Cave, TX (US)

(73) Assignee: Cirrus Logic, Inc., Austin, TX (US)

(*) Notice: Subject to any disclaimer, the term of this patent is extended or adjusted under 35 U.S.C. 154(b) by 0 days.

(21) Appl. No.: 14/745,795

(22) Filed: Jun. 22, 2015

(65) Prior Publication Data
US 2015/0380005 A1 Dec. 31, 2015

Related U.S. Application Data

(60) Provisional application No. 62/016,881, filed on Jun. 25, 2014.

(51) Int. Cl.
H04N 1/405 (2006.01)
H04N 1/407 (2006.01)
(Continued)

(52) U.S. Cl.
CPC ........... *G10L 19/04* (2013.01); *H03M 3/424* (2013.01); *H03M 3/428* (2013.01); *H03M 3/458* (2013.01); *H03M 3/466* (2013.01); *H03M 3/468* (2013.01)

(58) Field of Classification Search
CPC ..... H03M 3/412; H03M 3/424; H03M 7/304; H03M 3/452
(Continued)

(56) References Cited

U.S. PATENT DOCUMENTS 4,253,149 A * 2/1981 Cunningham ....... G05D 1/0206
318/588
4,631,749 A 12/1986 Rapaich
(Continued)

FOREIGN PATENT DOCUMENTS

CN 105284777 A 1/2016
EP 0173983 A2 3/1986
(Continued)

OTHER PUBLICATIONS

International Search Report and Written Opinion, International Application No. PCT/US2015/037101, mailed Jan. 4, 2016, 20 pages.
(Continued)

*Primary Examiner* — Akwasi M Sarpong
(74) *Attorney, Agent, or Firm* — Jackson Walker L.L.P.

(57) ABSTRACT

A system may include a delta-sigma analog-to-digital converter and a digital compression circuit. The delta-sigma analog-to-digital converter may include a loop filter having a loop filter input configured to receive an input signal and generate an intermediate signal responsive to the input signal, a multi-bit quantizer configured to quantize the intermediate signal into an uncompressed digital output signal, and a feedback digital-to-analog converter having a feedback output configured to generate a feedback output signal responsive to the uncompressed digital output signal in order to combine the input signal and the feedback output signal at the loop filter input. The digital compression circuit may be configured to receive the uncompressed digital output signal and compress the uncompressed digital output signal into a compressed digital output signal having fewer quantization levels than that of the uncompressed digital output signal.

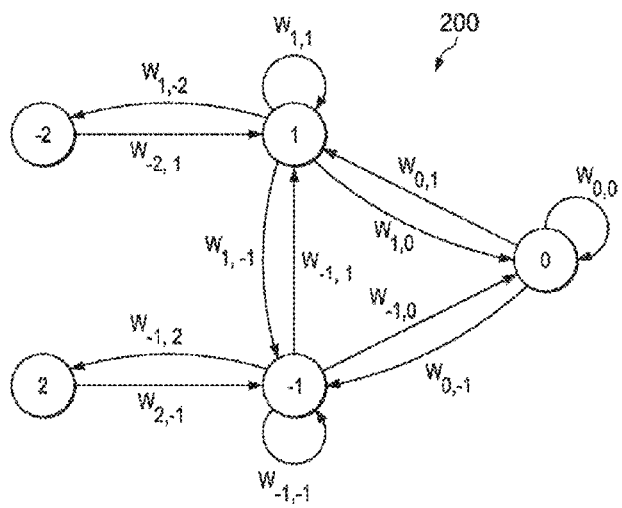

54 Claims, 4 Drawing Sheets